United States Patent [19]

Tanaka et al.

[11] Patent Number: 4,592,137
[45] Date of Patent: Jun. 3, 1986

[54] METHOD OF CIRCUIT CONNECTION ACROSS BOTH SURFACES OF SUBSTRATE

[75] Inventors: Souhei Tanaka, Neyagawa; Kazuhiro Mori, Katano; Eiji Itemadani, Sakai, all of Japan

[73] Assignee: Matsushita Electric Industrial Co., Ltd., Kadoma, Japan

[21] Appl. No.: 638,448

[22] PCT Filed: Nov. 22, 1983

[86] PCT No.: PCT/JP83/00417
§ 371 Date: Jul. 26, 1984
§ 102(e) Date: Jul. 26, 1984

[87] PCT Pub. No.: WO84/02248
PCT Pub. Date: Jun. 7, 1984

[30] Foreign Application Priority Data

Nov. 27, 1982 [JP] Japan ................................. 57-207914

[51] Int. Cl.$^4$ ............................................. H05K 13/04
[52] U.S. Cl. .................................... 29/843; 228/180.1
[58] Field of Search ..................... 29/843, 842, 845; 228/179, 180.1, 56.5

[56] References Cited

U.S. PATENT DOCUMENTS

| | | | |
|---|---|---|---|
| 2,915,678 | 12/1959 | Frazier et al. | 29/460 X |
| 3,002,481 | 10/1961 | Hutters | 29/874 X |
| 3,780,433 | 12/1973 | Lynch | 29/843 |
| 3,932,934 | 1/1976 | Lynch et al. | 29/843 |
| 4,373,259 | 2/1983 | Motsch | 228/180.1 X |

FOREIGN PATENT DOCUMENTS 50-29313 9/1975 Japan ................................. 29/843
51-67365 5/1976 Japan .

*Primary Examiner*—Howard N. Goldberg
*Assistant Examiner*—Carl J. Arbes
*Attorney, Agent, or Firm*—Wenderoth, Lind & Ponack

[57] ABSTRACT

According to this invention, an electrically conducting wire provided with a solder ball is inserted through throughholes provided around the perimeters thereof with electrically conductive members such as copper foils which form printed wiring on both surfaces of an insulating substrate. One of the conductive members and the conducting wire are soldered by dipping or flow-soldering, thereby making a circuit connection across both surfaces of the substrate by causing melting of the solder ball on the conducting wire on the substrate surface not soldered.

4 Claims, 8 Drawing Figures

METHOD OF CIRCUIT CONNECTION ACROSS BOTH SURFACES OF SUBSTRATE

TECHNICAL FIELD

The present invention relates to a method of making a circuit connection across both surfaces of substrate in the field of electronic circuit assembling technique.

BACKGROUND ART

Heretofore, for circuit connection across both surfaces of substrate, a through-hole substrate is generally known. Part of this through-hole substrate is shown in FIG. 1. Referring to FIG. 1, 1 denotes a substrate formed of an insulating resin; 2a and 2b denote copper foils which are electrically conductive members formed on both surfaces of substrate in respective specified patterns; 3 denotes a through-hole for fitting parts piercing the substrate 1 and copper foils 2a and 2b; 4 denotes a copper plating layer formed on the internal circumferential wall of the through-hole 3 and on copper foils 2a and 2b by chemical plating or electrical plating, which conductively communicates between the copper foils 2a and 2b. Numeral 5 designates a solder layer formed by dipping or flow-soldering. Such a through-hole substrate is expensive because of the cost for forming the copper plating layer 4 and is, therefore, hardly adaptable for commercial electronic equipment. Moreover, because of the fear of inadequate conduction resulting from lack of copper plating layer 4 at the end of the through-hole 3 or cutting-off of the copper plating layer 4 caused by inserting lead wires of parts, it has heretofore been necessary to ensure reliability of conduction by floating the solder 5 up over the copper foil 2a as shown in the drawing when conducting the dipping or flow-soldering and, accordingly, to strictly control the temperature of the solder tank and the soldering time. As a means for overcoming such a difficulty, a substrate to be printed on both surfaces thereof by through-pin system is available. FIG. 2 shows part of it. Referring to FIG. 2, 6 designates a conductive pin pressed into the through-hole 3, which is en bloc soldered on the bottom copper foil 2b by way of dipping or flow-soldering after mounting other electronic parts on the printed substrate and which is further soldered on the top copper foil 2a, thereby effecting conduction across the copper foils 2a and 2b. On such a printed substrate, connecting of the pin 6 with the copper foil 2a has heretofore had to be done by hand at low efficiency, because other electric parts existed on the same surface. Or when soldering the pin on the copper foil 2a, the solder 5 on the side of the copper foil 2b already soldered partly melts, resulting in inadequate conduction.

DISCLOSURE OF THE INVENTION

According to this invention, into through-holes each equipped on its perimeter with conductive members such as copper foils, etc., applied as printed wiring on both surfaces of insulating substrate, etc., an electrically conducting wire provided with a solder ball is inserted and by soldering the conductive member on one surface with the conducting wire by way of dipping or flow-soldering, etc., the conducting wire and the conductive member on the surface not being soldered are joined by melting the aforementioned solder ball, thereby making the circuit connection across both surfaces of substrate.

THE MOST PREFERABLE MODE IN EXERCISING THE INVENTION

Figure 1:
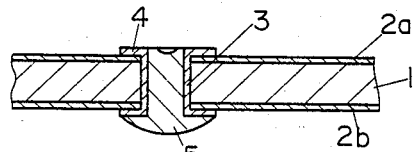
FIGS. 1 and 2 are sectional views of substrates each showing the conventional circuit connection across both surfaces of substrate.
Figure 2:
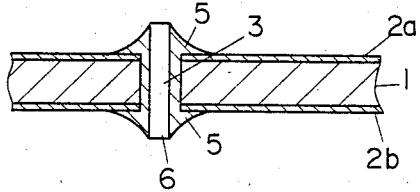
Figure 3:
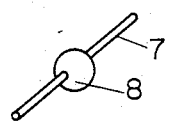
FIG. 3 is a perspective view of a conducting wire having a solder ball thereon which is an embodiment of this invention.

In the following, an embodiment of this invention is described in reference to the accompanying drawings. FIG. 3 shows a conducting wire forming one embodiment of this invention. Referring to FIGS. 3, 7 denotes an electrically conducting wire which is highly thermally conductive and which has a solder ball held nearly at the center thereof. The solder ball 8 is formed of a solder having a low melting point, e.g., 150° C.

Figure 4A:
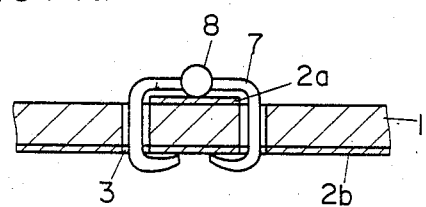
FIGS. 4a and 4b are sectional views of a substrate showing the connection forming process in the method of joining both surfaces of substrate, using the conducting wire of FIG. 3.
Figure 4B:
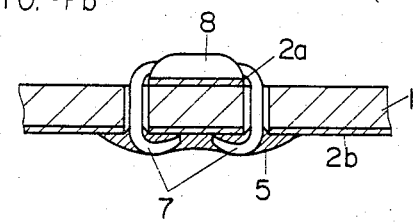

Such an electrically conducting wire 7 is first bent at a pitch for the through-holes 3, then inserted into the through-holes 3 in the substrate on which the copper foils 2a and 2b are formed, as shown in FIG. 4a, and crimped or bent over against the copper foil 2b side. The solder ball 8 is placed at the pitch center of the through-holes 3. The conducting wire 7 is fixed to the substrate 1 in the manner as shown in FIG. 4b. In another through-hole 3 in the substrate 1, a terminal of electronic part (not shown in the drawing) is inserted and held and it is soldered by way of normal dipping in molten solder or flow-soldering. Assuming that the melting temperature of the solder in the dipping or flow-soldering is 240°~250° C., when the copper foil 2b is dipped in a solder 5 bath for about 3 seconds, the heat of this molten solder is transmitted to the solder ball 8 through the conducting wire 7, causing the solder ball 8 having a lower melting point to be heated so as to melt. This molten solder flows along the conducting wire 7 and after the substrate 1 has been drawn up from the solder tank, the solder of the ball 8 solidifies, whereby the conducting wire 7 is soldered on the copper foil 2a. In this way after putting a conducting wire 7 having a solder ball 8 held thereon the copper foils 2a and 2b on the substrate 1 and inserting the terminal of an electronic part, the entire soldering process may be conducted simply by the dipping or flow-soldering step, etc., thereby completing not only the soldering of the electronic part, but the soldering of the conducting wire 7 on the copper foils 2a and 2b as well. In that way, the circuit connection across both surfaces of substrate may be made very efficiently. Moreover, because of the top and the bottom copper foils 2a and 2b being simultaneously soldered, there is no fear of inadequate conduction resulting as in the case of the through-pin system printed substrate. Thus a positive soldering is assured.

In the above-description, a solder ball 8 is used, but other alternatives may be included and the conducting wire 7 may include those having solder balls 8 held at equal pitches or those like taping.

Figure 5:
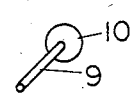
FIG. 5 is a perspective view of a conducting wire having a solder ball thereon which is another embodiment of this invention.

In the following, a second embodiment of this invention is described with reference to the accompanying drawings: FIG. 5 shows a conducting wire forming a further embodiment of this invention. Referring to FIGS. 5, 9 denotes a thermally highly conductive electricity conducting wire, which has a solder ball 10 held thereon at one end thereof. The solder ball 10 is formed of a solder having a low melting point, e.g., 150° C.

Figure 6A:
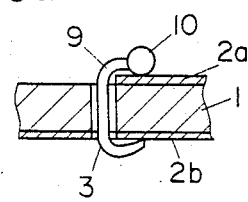
FIGS. 6a and 6b are sectional views of the substrate showing the forming process in the method of making the connection across both surfaces of substrate, using the conducting wire of FIG. 5.
Figure 6B:
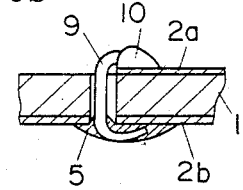

As shown in FIG. 6a, the electricity conducting wire 9 is inserted through a through-hole 3 in the substrate on which copper foils 2a and 2b are formed, and is crimped or bent over onto the copper foils 2a and 2b. The solder ball 10 is held on the copper foil 2a in contact therewith. Then, as shown in FIG. 6b, the conducting wire 9 and the solder ball 10 are affixed to the substrate 1. Further, in another through-hole 3 in the substrate, terminal of electronic part (not shown in the drawing) is inserted and held thereon. Then it is dipped in molten solder, thereby conducting the soldering by way of dipping or flow-soldering. Thereafter, similar procedure is followed as in the first embodiment.

INDUSTRIAL APPLICABILITY

As hereabove described, the method of circuit connection across both surfaces of substrate of this invention is composed by attaching an electricity conducting wire onto a substrate having conductive members on both surfaces thereof and holding a solder ball on the conducting wire and during soldering on the surface opposite the side where the solder ball is held, the solder ball is melted by this soldering heat, thereby effecting simultaneous soldering of conductive members on both surfaces of the substrate. In that way, a method excellent in workability, reliability and in the aspect of price is realized.

What is claimed is:

1. A method of making a circuit connection between opposite surfaces of a substrate, comprising:
providing a substrate having at least one hole therethrough and having a first electrically conductive member provided around the periphery of said hole on one surface of said substrate and a further electrically conductive member provided around only a part of said hole on the other surface of said substrate;
inserting an electrically conductive wire through said hole and providing a first bent portion on the part of the wire projecting from said one surface in confronting relationship with said first electrically conductive member and providing a second bent portion on the part of the wire projecting from the other surface in confronting relationship with said further electrically conductive member;
providing a first solder having a first melting point only at a position where said second bent portion confronts said further electrically conductive member; and
soldering said first bent portion to said first electrically conductive member by a dip method or a flow solder method with a second solder having a melting point at least as high as said first solder and continuing said soldering step until said first solder is fused for soldering said second bent portion to said further electrically conducting member.

2. A method as claimed in claim 1 in which the step of providing said first solder comprises providing a ball of said first solder on said second bent portion of said wire.

3. A method as claimed in claim 1 wherein said substrate has a second hole therein and said further electrically conductive member extends to said second hole and is around only a part of the periphery of said second hole, and said second portion of said wire is further bent through said second hole and has the end thereof bent into confronting relationship with said first electrically conductive method, and said soldering step includes soldering said further bent second portion of said wire to said first electrically conductive member by the dip method or the flow solder method.

4. A method as claimed in claim 3 in which the step of providing said first solder comprises providing a ball of said first solder on said second bent portion of said wire.

* * * * *